United States Patent
Calderon et al.

(10) Patent No.: US 8,392,788 B2
(45) Date of Patent: Mar. 5, 2013

(54) TRANSPORT NETWORK SYSTEM WITH TRANSPARENT TRANSPORT AND METHOD OF OPERATION THEREOF

(75) Inventors: Juan-Carlos Calderon, Fremont, CA (US); Arun Zarabi, Sacramento, CA (US); Jean-Michel Caia, Plymouth, CA (US)

(73) Assignee: Cortina Systems, Inc., Sunnyvale, CA (US)

( * ) Notice: Subject to any disclaimer, the term of this patent is extended or adjusted under 35 U.S.C. 154(b) by 631 days.

(21) Appl. No.: 12/625,551

(22) Filed: Nov. 24, 2009

(65) Prior Publication Data

US 2011/0126074 A1    May 26, 2011

(51) Int. Cl.
*H03M 13/00* (2006.01)

(52) U.S. Cl. .......................... 714/752; 714/755

(58) Field of Classification Search .................. 714/752, 714/755
See application file for complete search history.

(56) References Cited

U.S. PATENT DOCUMENTS

| | | | |
|---|---|---|---|
| 6,829,741 B1 | 12/2004 | Khansari et al. | |
| 7,028,241 B1 * | 4/2006 | Blair et al. | 714/752 |
| 7,231,575 B2 | 6/2007 | Kauschke et al. | |
| 7,246,294 B2 | 7/2007 | Kauschke et al. | |
| 7,260,767 B2 | 8/2007 | Bhattacharya et al. | |
| 7,278,081 B1 * | 10/2007 | Blair et al. | 714/752 |
| 7,415,658 B2 | 8/2008 | Linkewitsch | |
| 2002/0056064 A1 | 5/2002 | Kidorf et al. | |
| 2005/0149820 A1 | 7/2005 | Gastaldello et al. | |
| 2007/0157060 A1 * | 7/2007 | Ganga et al. | 714/752 |
| 2007/0211750 A1 | 9/2007 | Li et al. | |
| 2009/0201988 A1 | 8/2009 | Gazier et al. | |

OTHER PUBLICATIONS

International Search Report for PCT Application No. PCT/US2010/056832 dated Jan. 11, 2011.

* cited by examiner

*Primary Examiner* — Charles Ehne
(74) *Attorney, Agent, or Firm* — Ishimaru & Associates LLP; Mikio Ishimaru

(57) ABSTRACT

A method of manufacture a transport network system includes: receiving input data having an input encoding; generating encoded data, having a transcode encoding, from the input data; generating an error correction redundancy for the encoded data; and sending an output frame, having the encoded data and the error correction redundancy, for increasing a net coding gain of the output frame based on the transcode encoding and the error correction redundancy.

17 Claims, 9 Drawing Sheets

TRANSPORT NETWORK SYSTEM WITH TRANSPARENT TRANSPORT AND METHOD OF OPERATION THEREOF

TECHNICAL FIELD

The present invention relates generally to a transport network system, and more particularly to a system for a transport network system with transparent transport.

BACKGROUND ART

The capacity of long-haul communication systems, such as undersea or submarine communication systems, has been increasing at a substantial rate for the transmission of significant amounts of data. For example, some long-haul optically amplified undersea communication systems are capable of transferring information at speeds of 10 gigabits per second (Gbps) or higher across great distances that often span from continent to continent.

Long-haul communication systems are particularly susceptible to noise and pulse distortion given the relatively long distances over which the signals must travel in a transmission channel. During transmission, data can become corrupted from noise within transmission channels, faults in transmission or receiving devices, or data errors from reading to and writing from an elastic store.

Various techniques are used to improve performance of a transmission channel to minimize the error probability of the data being transmitted. Such improved performance is necessary in order to reduce the bit error rate (BER) at a given value of signal to noise ratio (SNR) or to have the same bit error rate but at a lower value of the signal to noise ratio.

Thus, a need still remains for a transport network system providing increasing system capacity, improving transmission reliability, and increasing transmission length. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a transport network system including: receiving input data having an input encoding; generating encoded data, having a transcode encoding, from the input data; generating an error correction redundancy for the encoded data; and sending an output frame, having the encoded data and the error correction redundancy, for increasing a net coding gain of the output frame based on the transcode encoding and the error correction redundancy.

The present invention provides a transport network system, including: a transparent mapping unit for receiving input data having an input encoding and generating encoded data, having a transcode encoding, from the input data; a redundancy generation unit, coupled to the transparent mapping unit, for generating an error correction redundancy for the encoded data; and a transmit line interface unit, coupled to the redundancy generation unit, for sending an output frame, having the encoded data and the error correction redundancy, for increasing a net coding gain of the output frame based on the transcode encoding and the error correction redundancy.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
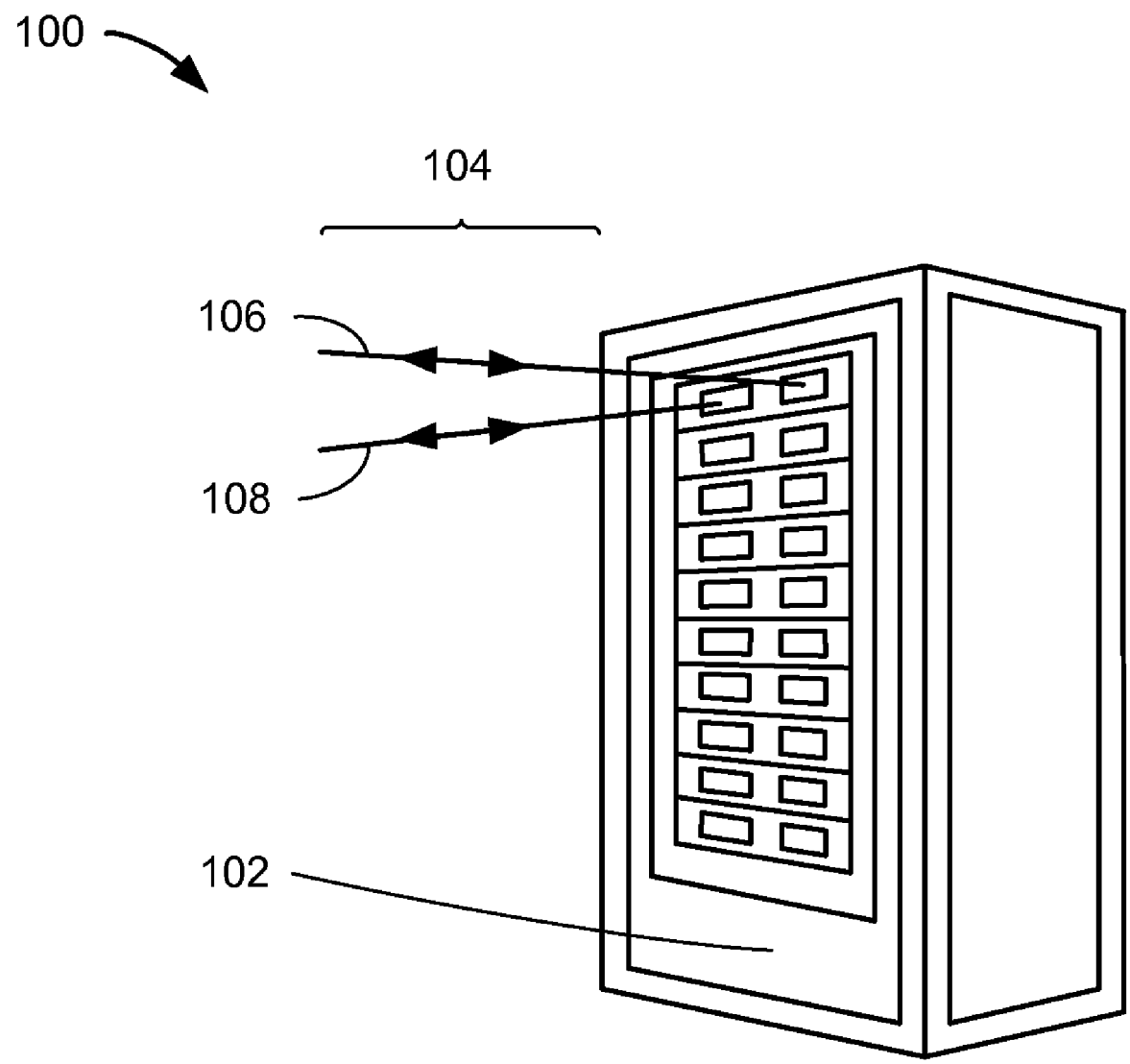
FIG. 1 is an example of a transport network system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

Referring now to FIG. 1, therein is shown an example of a transport network system 100 in a first embodiment of the present invention. The transport network system 100 can represent any embodiments of the present invention described later.

The transport network system 100 can include a network element 102 that can provide functionalities including transport, multiplexing, switching, management, supervision, survivability, or a combination thereof, for carrying client signals via a communication path 104. For example, the network element 102 can include an element of a transport system in a network for applications including optical transport network (OTN), multi-service platform, submarine and ultra long haul (ULH), high density line card, forward error correction (FEC) regenerator, protocol transparent transport, SONET/SDH add/drop multiplexer, core network, metro network, and local-area-network monitoring.

The communication path 104 can include input/output channels such as optical fiber channels, electrical channels, or any communication channels. The communication path 104 can include a client channel 106 and a line channel 108 for providing input and output to communicate with the client side and the line side, respectively. For example, the client channel 106 and the line channel 108 can be used to transport the client signals from the client side to the network element 102 and from the network element 102 to the line side, respectively.

The client side can transport client signals in networks and/or services including Synchronous Optical Network (SONET), Synchronous Digital Hierarchy (SDH), Asynchronous Transfer Mode (ATM), Ethernet, Internet Protocol (IP), Multi-Protocol Label Switching (MPLS), Storage protocols (e.g. Fibre Channel (FC)), Enterprise Systems Connect (ESCON), Fibre Connectivity (FICON), digital video transport, or a combination thereof as examples. The client side can operate at any transmission rate including 8 gigabits per second (Gbps), 10 Gbps, 40 Gbps, and 100 Gbps, as examples.

The line side can transport client signals in networks including OTN networks or any networks in the Core, Metro Core, and Metro Access. The line side can operate at any transmission rate including the transmission rates of Optical Transport Unit (OTU), OTUk, OTUkV, OTUkeV, and OTUkfV where k can include 1, 2, 3, and 4 as examples for indicating the supported bit rate.

The transport network system 100 can transport client signals from the client channel 106 for which the Physical Coding Sub-Layer (PCS) can be compressed and mapped over a signal on the line channel 108. For example, client signals using a 64b/66b encoding at the Physical Coding Sub-Layer (PCS) can be converted to a 512b/513b encoding and carried over OTU, OTUk, OTUkV, OTUkeV, or OTUkfV.

The 64b/66b encoding includes 8 bytes (i.e. 64 bits) of data byte(s), control byte(s), or a combination thereof and 2 bits of preamble, which can include a synchronization header, a sync header, or a sync pattern. The preamble can indicate if the 8 bytes include data, control, or a combination thereof. The 512b/513b encoding includes 64 bytes (i.e. 512 bits) of data, control, or a combination thereof and 1 bit for indicating if the first 8 bytes include control information.

Also for example, client signals including 8 Gbps FC using an 8b/10b encoding can be converted, mapped into a transparent generic framing procedure (GFP-T) frame, and carried over an OTU2.

The transport network system 100 can include any number of the client channel 106 and the line channel 108. The communication path 104 can be used by the network element 102 to communicate with another of the network element 102 in the transport network system 100.

Figure 2:
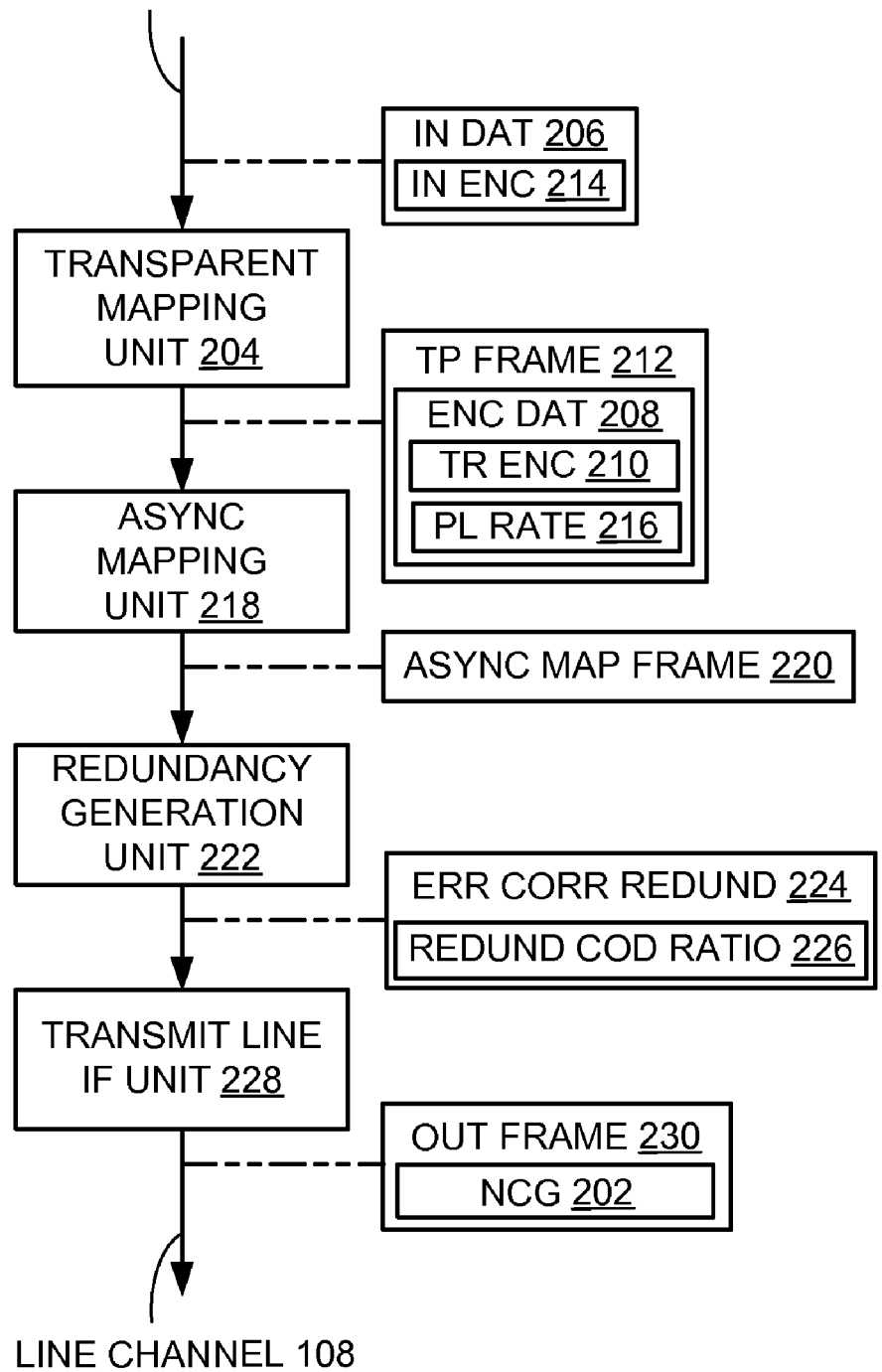
FIG. 2 is a portion of the transport network system of FIG. 1.

Referring now to FIG. 2, therein is shown a portion of the transport network system 100 of FIG. 1. The transport network system 100 can include transmission of the client signals from the client channel 106 to the line channel 108 and vice versa.

The transport network system 100 can provide timing transparent transport, asynchronous mapping of client signals received at constant bit rate (CBR) in the client channel 106 over the original transmission rate of the line channel 108, and a strong error correction capability for increasing a net coding gain 202 in the line channel 108. The net coding gain 202 represents a measure that allows a system designer to determine how fast data can be transmitted, how reliable data can be transmitted, or how far the data can be transmitted. The net coding gain 202 can be defined as a difference between the signal-to-noise ratio (SNR) of a system without the error correction code and the SNR of a system with the error correction code based on a bit error rate (BER). An increase in the net coding gain 202 can provide a decrease of the transmit power, an increase in transmission distance, or a decrease in the received BER.

The transport network system 100 can include a transparent mapping unit 204. The transparent mapping unit 204 can function to map incoming data to generate another form of data without regard to the incoming data partition. The transparent mapping unit 204 can receive input data 206 on the client channel 106. The input data 206 can represent the client signals from the client channel 106.

The transparent mapping unit 204 can receive the input data 206 having an input encoding 214 from the client channel 106. The input encoding 214 represents a conversion of the input data 206 before transmission and often converted to aid in the transmission of the input data 206.

The input encoding 214 can include any encoding of the input data 206 such that there are as many ones as zeros transmitted (i.e. dc-balanced), not many ones or zeros transmitted in a row, and enough state changes to allow clock recovery at the receiving side. An encoding can refer to a format for representing source information converted from one form to another. For example, the input encoding 214 can be a 64b/66b encoding.

The transparent mapping unit 204 can transcode the input data 206. Transcoding can include converting data representation from an encoding to a different encoding. For example, the input data 206 can be transcoded by converting the input data 206 from the input encoding 214 to a different encoding.

The transparent mapping unit 204 can transcode the input data 206 to generate encoded data 208. The encoded data 208 can be defined as information converted from the input data 206 using a different encoding that is more efficient than the input encoding 214.

The encoded data 208 can include a transcode encoding 210. The transcode encoding 210 represents a conversion of the encoded data 208 from the input data 206 for preparation for additional transmission. The transcode encoding 210 can be defined as an encoding that is different and more efficient than the input encoding 214.

The transcode encoding 210 can include an overhead having a different information structure with less number of bits than the input data 206. For example, the transcode encoding 210 can be a 512b/513b encoding. The 512b/513b encoding is more efficient than the 64b/66b encoding since the 512b/513b encoding includes 1 bit of overhead per 512 bits of information compared to the 64b/66b encoding having 2 bits of overhead per 64 bits of information.

The transparent mapping unit 204 can include a timing-transparent method, which can be defined as a mapping/ demapping procedure that allows a transparent transport of the original bit rate of the client signal. In other words, the rate of the original client can be easily recreated from the rate of the transcoded stream.

The mapping procedure can include functions for generating an information unit including client information, identifying the inter-frame information, and removing the inter-frame information. With a cut-through operation, the transparent mapping unit 204 can reduce the overall time for processing and transmitting the client information without a need to store an entire client frame before transmission, thereby providing low latency for applications and protocols that are sensitive to transmission delay. Alternatively, with a store and forward operation, the transparent mapping unit 204 can store an entire client frame before transmission.

With the timing-transparent method, the transparent mapping unit 204 can generate a transparent mapped frame 212, which can be defined as a unit of information that includes any type of client information including data and control. The transparent mapped frame 212 can be generated with the encoded data 208.

The transparent mapped frame 212 can include multiple blocks of the encoded data 208. The transparent mapped frame 212 can include a fixed length. The transparent mapped frame 212 can include client data and control codes.

Generating the encoded data 208 can include generating the encoded data 208 with the transcode encoding 210 that is different from the input encoding 214. For example, generating the encoded data 208 can include generating the encoded data 208 having a 512b/513b encoding from the input data 206.

The input data 206 can include synchronization headers and client payload. The synchronization headers can indicate if the client payload contains data or control characters. Multiple blocks of the input data 206 can be combined to generate a block of the encoded data 208.

Generating the encoded data 208 can include converting the input data 206 to the encoded data 208 with less number of bits in a different information structure, thereby reducing a payload capacity rate 216 of the encoded data 208 based on the transcode encoding 210. The payload capacity rate 216 can represent a payload, such as user information or client data, which can be included in a frame, a container, or a transport unit and transmitted over a time period. The payload capacity rate 216 of the encoded data 208 can be defined as the amount of the encoded data 208 that can be transferred in a frame or a container over a time period through a communication channel or a network.

The input data 206 can be encoded into the encoded data 208 with less number of bits compared to the input data 206. For example, a field in the client payload containing control characters in the input data 206 can be encoded to generate a control type in the encoded data 208. Such encoding can be performed with a lookup table which can be hardcoded or programmed.

The transparent mapping unit 204 can generate the transparent mapped frame 212 with the encoded data 208 by combining multiple blocks of the encoded data 208 and map them into the transparent mapped frame 212. The number of blocks of the encoded data 208 mapped into the transparent mapped frame 212 can depend on the rate of the input data 206 (i.e. the data rate of the client signals) received from the client channel 106 and the rate of transmitting the transparent mapped frame 212. For example, the minimum number of blocks of the encoded data 208 mapped into the transparent mapped frame 212 can be configured such that the fastest rate of the input data 206 is less than the slowest rate of transmitting the transparent mapped frame 212.

Configuring the minimum number of blocks of the encoded data 208 so that the time required transmitting the transparent mapped frame 212 is less than the time in which the input data 206 can be delivered to the transparent mapping unit 204. Such configuration can provide a timing-transparent method for transporting client signals and maintaining client timing transparency.

The transport network system 100 can include an asynchronous mapping unit 218 coupled to the transparent mapping unit 204. The asynchronous mapping unit 218 can include functions for mapping the encoded data 208 in the transparent mapped frame 212 into an asynchronous mapped frame 220.

The asynchronous mapping unit 218 can include any asynchronous mapping methods. The asynchronous mapping methods can include a procedure that supports various client signals.

For example, the asynchronous mapping methods include a generic mapping procedure (GMP) to map a client signal to an optical channel payload unit (OPU). The (IMP is a mapping method that provides flexibility for asynchronously mapping constant bit rate (CBR) client signals including 40 Gigabit Ethernet (GbE) or 100 GbE.

The asynchronous mapped frame 220 can represent a unit of information generated based on a local clock that is different than the clock used for transmission of the client signal. The local clock and the clock used for transmission of the client signal can be out of phase; thereby the local clock is asynchronous to the clock used for transmission of the client signal.

The asynchronous mapping unit 218 can include functions for providing asynchronous mapping of the transparent mapped frame 212 with the local clock and adapting the rate differences between the rate of the input data 206 and the rate of transmitting the data unit. The data unit can include justification commands for indicating the number of negative and positive justification opportunity bytes to adapting to the rate differences. Asynchronous mapping of the transparent mapped frame 212 can decouple the client timing and the line timing while maintaining the client timing transparency with the transparent mapping unit 204.

The transport network system 100 can include a redundancy generation unit 222, which can include functions for generating an error correction redundancy 224 for the asynchronous mapped frame 220. The error correction redundancy 224 represents some additional information, such as a redundancy or an overhead, which can be used to correct data that has been transmitted. The error correction redundancy 224 can be generated based on the data it is protecting.

The error correction redundancy 224 can include an overhead in a message sent by a sending network element to a receiving network element for extracting the original data sequence. The receiving network element can extract the original data sequence based on the error correction redundancy 224 to correct errors due to noise and interference in the line channel 108.

The redundancy generation unit 222 can be coupled to the transparent mapping unit 204 via the asynchronous mapping unit 218. The error correction redundancy 224 can be generated with any generator polynomials based on a number of error correction codes including forward error correction (FEC) codes, strong FEC, ultra FEC, BCH codes, Reed-Solomon (RS) codes, turbo product codes, turbo codes, Viterbi FEC codes, Golay codes, low density parity check (LDPC) codes, or block codes, as examples.

The error correction redundancy 224 can be generated with any number of concatenated code classes. For example, two orthogonally concatenated Bose-Chaudhuri-Hocquengham (BCH) code classes can be used to generate the error correction redundancy 224. The error correction redundancy 224 can also be generated with any encoding scheme including a concatenated coding with an algebraic code followed by a convolutional code.

By reducing the payload capacity rate 216 of the encoded data 208, the transport network system 100 can increase a redundancy coding ratio 226 for the error correction redundancy 224. The redundancy coding ratio 226 can include a ratio of the number of information symbols covered by the error correction redundancy 224 to the total number of codeword symbols.

The total number of codeword symbols can include the information symbols and the error correction redundancy 224. The redundancy coding ratio 226 can be selected such that the transport network system 100 can operate at a transmission rate that matches the original transmission rate of the line channel 108.

The redundancy coding ratio 226 can be configured or preset to a predetermined value to achieve a desired value of the net coding gain 202. For example, the redundancy coding ratio 226 can include an approximate range of 3.6% to 26% to achieve the net coding gain 202 in an approximate theoretical limit range of 8.8 dB to 11.4 dB with a hard decision FEC code. Also for example, the redundancy coding ratio 226 can include an approximate range of 3.6% to 26% to achieve the net coding gain 202 in an approximate theoretical limit range of 9.3 dB to 12.6 dB with a soft decision FEC code.

A hard decision FEC coder/decoder can operate on data that include a set of possible values (typically 0 or 1 in a binary code) that represent a decision. A soft decision FEC coder/decoder can operate on data that include a range of values that represent the decision along with side information, which provide a measure of confidence for the decision. The side information can indicate the reliability of each data value and can be used to form better estimates of the original data in a soft decision FEC decoder. Thus, the soft decision FEC decoder can typically perform better in the presence of corrupted data than a hard decision FEC decoder.

As an example, the redundancy coding ratio 226 of 7% can be supported with an FEC code of RS(255,239) to provide the net coding gain 202 of approximately 6.2 dB. Also as an example, the redundancy coding ratio 226 of 23.6% can be supported with an FEC code of LDPC(3639,3213) to provide the net coding gain 202 of approximately 10.9 dB at a bit error rate (BER) of 1e-13 or a projected value of the net coding gain 202 of approximately 11.3 dB at a BER of 1e-15.

It is understood that there can be non-transcoded payload rates (e.g. Ethernet or Fibre Channel) but with a higher or lower line rate than a standard or typical rate with a strong FEC, which can have a redundancy larger (for a higher line rate) or smaller (for a lower line rate) than a standard or basic (e.g. 7% FEC) redundancy. By transcoding the payload, the redundancy coding ratio 226 can be increased, thereby improving the net coding gain 202.

For example, a 100GE payload can be mapped to an OTU4V at a rate of ×1 and the error correction redundancy 224 having the redundancy coding ratio 226 of approximately 12% can result in the net coding gain 202 of approximately 9.4 dB. By transcoding the 100GE payload with the payload capacity rate 216 reduced to a predetermined value of approximately 3%, the redundancy coding ratio 226 of approximately 15% can increase the net coding gain 202 to approximately 9.8 dB.

Also for example, a LOGE payload can be mapped to an OTU2 eV at a rate of ×2 and the error correction redundancy 224 having the redundancy coding ratio 226 of approximately 10% can result in the net coding gain 202 of approximately 9.2 dB. By transcoding the 10GE payload with the payload capacity rate 216 reduced to a predetermined value of approximately 3%, the redundancy coding ratio 226 of approximately 13% can increase the net coding gain 202 to approximately 9.6 dB.

Further for example, a LOGE payload can be mapped to an OTU2 at a rate of ×3 and the error correction redundancy 224 having the redundancy coding ratio 226 of approximately 4% can result in the net coding gain 202 of approximately 7 dB. By transcoding the 10GE payload with the payload capacity rate 216 reduced to a predetermined value of approximately 3%, the redundancy coding ratio 226 of approximately 7% can increase the net coding gain 202 to approximately 8.2 dB to 8.6 dB.

The transport network system 100 can include a transmit line interface unit 228 coupled to the redundancy generation unit 222. The transmit line interface unit 228 can include functions for generating an output frame 230, which represents a unit of information sent by a sending network element to a receiving network element. The output frame 230 can include an overhead, client data, and a redundancy.

The overhead can include information related to operation, administration, and maintenance functions. The client data can include the encoded data 208 in the asynchronous mapped frame 220. The redundancy can include the error correction redundancy 224 for purposes of error detection and correction when communicating over a noisy communication channel.

The transmission rate for transmitting the output frame 230 to the line channel 108 can include the original rate of the line channel 108. For example, the original rate of the line channel 108 can include OTU2e/OTU3e overclocked rate in an OTN network.

For illustrative purposes, the transport network system 100 is shown to include a transmission path from the client channel 106 to the line channel 108, although it is understood that the transport network system 100 can include a transmission path from the line channel 108 to the client channel 106. The functions that can be included in the transmission path from the line channel 108 to the client channel 106 can include reception of the output frame 230, error detection and correction of the asynchronous mapped frame 220 with the error correction redundancy 224, de-mapping of the asynchronous mapped frame 220, and de-mapping of the transparent mapped frame 212 to extract and transmit the client signals to the client channel 106.

Also for illustrative purposes, the transport network system 100 is shown with the partition having the transparent mapping unit 204, the asynchronous mapping unit 218, the redundancy generation unit 222, and the transmit line interface unit 228, although it is understood that the transport network system 100 can have a different partition and order. For example, the transparent mapping unit 204 and the asynchronous mapping unit 218 can be grouped into a block including a wrapper unit. Also for example, the insertion of the error correction redundancy 224 into the output frame 230 can be performed by the redundancy generation unit 222.

The transmit line interface unit 228 can insert the error correction redundancy 224 in the output frame 230. For example, the output frame 230 can represent an optical channel transport unit-k (OTUk), where k can be any value such as 2, 3, and 4 for transmission of 10G, 40G, and 100G client signals. The transmit line interface unit 228 can send the output frame 230, having the encoded data 208 and the error correction redundancy 224, for increasing the net coding gain 202 of the output frame 230 based on the transcode encoding 210 and the error correction redundancy 224.

For example, reducing the payload capacity rate 216 of the output frame 230 by approximately 3% based on the transcode encoding 210 and selecting the redundancy coding ratio 226 approximately equal to 10% of the output frame 230 for the error correction redundancy 224 can provide sending the output frame 230 for increasing the net coding gain 202 of the output frame 230. The net coding gain 202 can be approximately equal to 9.2 dB. The error correction redundancy 224 can be generated using a strong or ultra FEC scheme. The increasing of the net coding gain 202 can be based on the 512b/513b encoding of the encoded data 208 and the redundancy coding ratio 226 approximately equal to 10% of the output frame 230.

Further to the discovery, the present invention provides the transport network system 100 for improved transmission reliability and increased transmission length resulting from increasing the net coding gain 202 on the line channel 108. The present invention maintains the client timing transparency and the original transmission rate of the line channel 108 from increasing the net coding gain 202. Increasing the net coding gain 202 can be achieved with the transparent mapping unit 204, the asynchronous mapping unit 218, and the redundancy generation unit 222. Increasing the net coding gain 202 can provide an advantage of allowing a longer reach, cheaper optics, or a combination thereof.

It has also been discovered that the present invention provides the transport network system 100 for providing the net coding gain 202 that can be higher than competing solutions. For example, the present invention can provide the net coding gain 202 of approximately 9.2 dB compared to up to 8.6 dB with current solutions using standard G.709 FEC and strong FEC in G.975.

Figure 3:
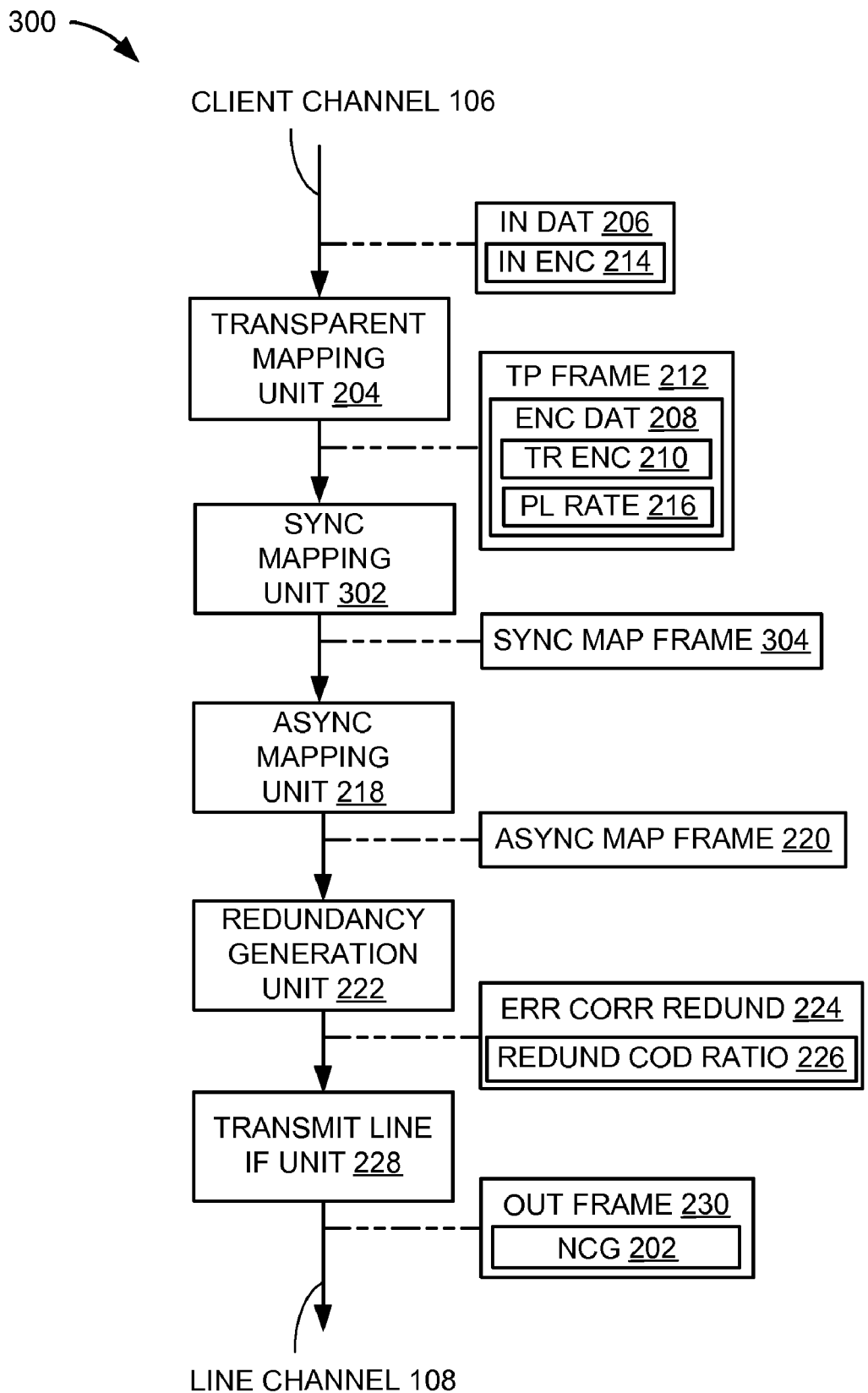
FIG. 3 is a portion of a transport network system in a second embodiment of the present invention.

Referring now to FIG. 3, therein is shown a portion of a transport network system 300 in a second embodiment of the present invention. The portion of the transport network system 300 includes similarities to that of the transport network system 100 of FIG. 2. The transport network system 300 can also include a synchronous mapping unit 302.

The synchronous mapping unit 302 can include functions for performing synchronous mapping of the transparent mapped frame 212 to generate a synchronous mapped frame 304. Synchronous mapping can be performed with a clock derived from the clock of the client signal based on a predetermined clock ratio and may not need justification commands.

The synchronous mapped frame 304 can include fixed stuff bytes for multiplexing or aggregating multiple data units. The fixed stuff bytes can refer to bits in a frame or a container that do not represent any client data or real information.

The fixed stuff bytes are used only to populate a portion of a frame or a container when the nominal client data rate is less than the nominal rate of transmitting the frame or the container. For example, the fixed stuff bytes can be added for multiplexing four optical data unit type 2 (ODU2s) into an optical data unit type 3 (ODU3).

The number of the fixed stuff bytes can be encoded in justification control bytes. The synchronous mapped frame 304 can be sent to the asynchronous mapping unit 218 for further processing as previous described in FIG. 2.

For illustrative purposes, the transport network system 300 is shown with the partition having the transparent mapping unit 204, the synchronous mapping unit 302, the asynchronous mapping unit 218, the redundancy generation unit 222, and the transmit line interface unit 228, although it is understood that the transport network system 300 can have a different partition and order. For example, the synchronous mapping unit 302 and the asynchronous mapping unit 218 can be grouped into a block including a wrapper unit. Also for example, the insertion of the error correction redundancy 224 into the output frame 230 can be performed by the redundancy generation unit 222.

Figure 4:
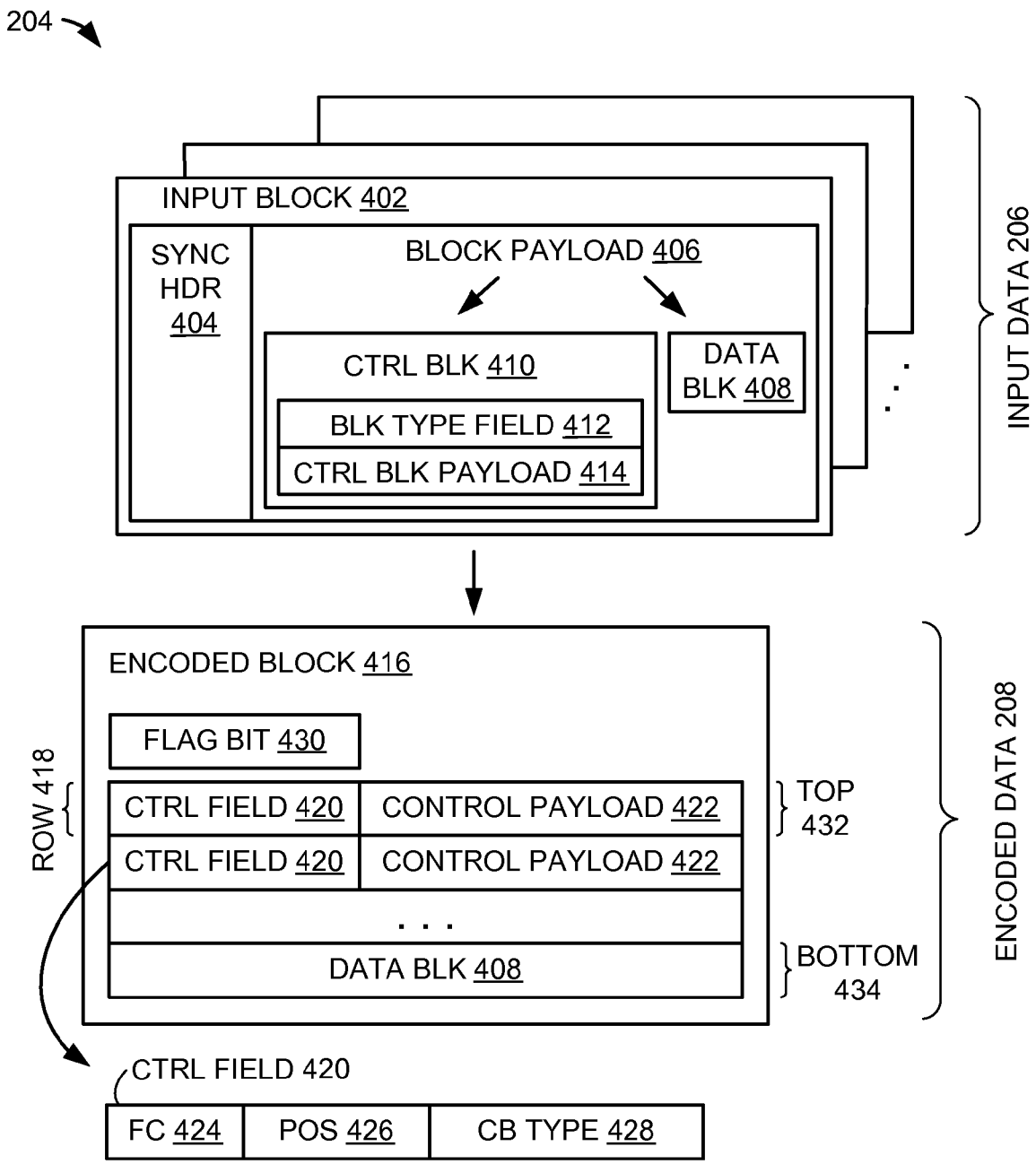
FIG. 4 is a transcoding function of the transparent mapping unit of FIG. 2.

Referring now to FIG. 4, therein is shown a transcoding function of the transparent mapping unit 204 of FIG. 2. The transcoding function can include converting the input data 206 to the encoded data 208 having a different information structure with less number of bits than the input data 206.

The transparent mapping unit 204 can receive an input block 402 having the input encoding 214 of FIG. 2 from the client channel 106. The input data 206 can represent the client signals from the client channel 106. The input block 402 can include a block of the input data 206 encoded with the input encoding 214 of FIG. 2.

For example, the input block 402 can include a 64b/66b block or an 8b/10b block. Also as an example, the input block 402 can include a block of a client signal for which the Physical Coding Sub-Layer (PCS) can be compressed and mapped over an OTN signal.

The input block 402 can include a sync header 404 and a block payload 406. The sync header 404 can be encoded in any number of bits for indicating the format of the input block 402. For example, the sync header 404 can indicate that the input block 402 is a data block 408 or a control block 410.

The block payload 406 can include the data block 408. The data block 408 can be formed in any number of bits or bytes. For example, the block payload 406 of the data block 408 can be formed in eight bytes.

The block payload 406 can include the control block 410. The control block 410 can be formed in any number of bits or bytes. For example, the block payload 406 of the control block 410 can be formed in eight bytes.

The block payload 406 of the control block 410 can include a block type field 412. The block type field 412 can represent control or status information of the control block 410. For example, the block type field 412 can include information for indicating a start of a data sequence, an end of a data sequence, a remote fault status, or a local fault status.

The block type field 412 can include a number of predefined types of the control block 410. Each of the predefined types can indicate the format of the remaining bits in the block payload 406. The block type field 412 can be encoded in any number of bits.

The block payload 406 of the control block 410 can include a control block payload 414. The control block payload 414 can include control characters, data characters, ordered-set characters, and a variable-length string of binary bit '1' based on the format (i.e. numbers and bit positions thereof) indicated by the block type field 412.

Multiple blocks of the input block 402 can be combined to generate an encoded block 416 of the encoded data 208. For example, eight of the input block 402 can be combined to generate the encoded block 416.

The information of the data block 408 and the control block 410 can be included in a row 418 of the encoded block 416. The row 418 that includes information of the data block 408 can include the block payload 406 of the data block 408.

The row 418 having the control block 410 can include a control field 420. The control field 420 can include information related to identification, position, and type of the control block 410.

The control field 420 can include a flag continuation field 424. The flag continuation field 424 can identify whether the next row does or does not include information of another of the control block 410.

The control field 420 can include a position field 426. The position field 426 can indicate the position of the control block 410 in the receiving order of a sequence of the input block 402 that makes up the encoded block 416.

The control field 420 can include a control block type 428. The control block type 428 can indicate a start of a data sequence, an end of a data sequence, a remote fault status, or a local fault status. The control block type 428 can represent a value converted from the block type field 412. The control block type 428 can be encoded by translating a value of the block type field 412 into another value with less number of bits compared to the block type field 412.

The block type field 412 can be encoded using a lookup table which can be hardcoded or programmed. The lookup table can include a table having a predefined mapping of the control block type 428 to the block type field 412. The lookup table can include a table that can be programmed via firmware or software for mapping the control block type 428 to the block type field 412.

The row 418 having the control block 410 can include a control payload 422. The control payload 422 can include the control block payload 414.

The encoded block 416 can include a flag bit 430. The flag bit 430 can indicate whether the first of the row 418 includes information of the data block 408 or the control block 410. The row 418 in the encoded block 416 can be transmitted in an order from a top 432 of the encoded block 416 to a bottom 434 of the encoded block 416.

The block payload 406 of the data block 408 can be sorted to the bottom 434 in the receiving order of a sequence of the input block 402 that makes up the encoded block 416. Sorting to the bottom 434 can include placing the block payload 406 of the data block 408 in the lower most of the row 418 in the encoded block 416.

The block payload 406 of the control block 410 can be sorted to the top 432 in the receiving order of a sequence of the input block 402 that makes up the encoded block 416. Sorting to the top 432 can include placing the block payload 406 of the data block 408 in the upper most of the row 418 in the encoded block 416.

It is understood that the transcoding can be performed with any structure or format of the input block 402 and the encoded block 416. Transcoding a number of the input block 402 to the encoded block 416 can include encoding some information of the input block 402 with less number of bits, reducing the amount of payload to be transmitted thereby. Encoding some information of the input block 402 can include transforming information of the sync header 404 and the block type field 412 to a combination of the control field 420 and the flag bit 430.

Figure 5:
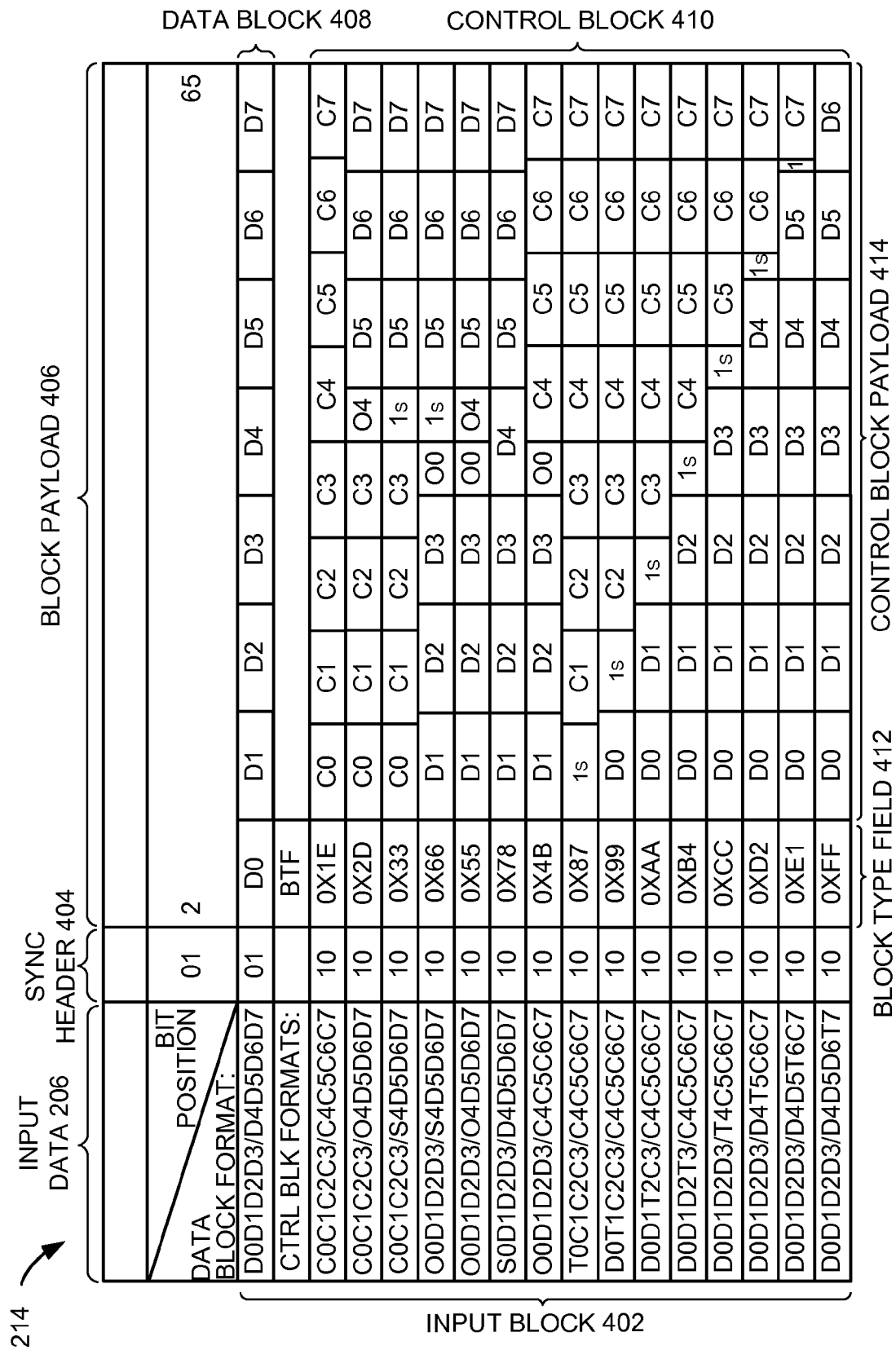
FIG. 5 is an example of the input encoding of the input data of FIG. 2.

Referring now to FIG. 5, therein is an example of the input encoding 214 of the input data 206 of FIG. 2. The input block 402 can include a block of the input data 206 encoded with the input encoding 214 of FIG. 2 and FIG. 3. The example depicts the input block 402 with the input encoding 214 as a 64b/66b encoding.

The input block 402 can include the sync header 404 and the block payload 406. The sync header 404 can be encoded in two bits for indicating the format of the input block 402. For example, the sync header 404 of "01" and "10" can indicate that the input block 402 is the data block 408 and the control block 410, respectively.

The block payload 406 of the data block 408 can be formed in any number of bits or bytes. For example, the block payload 406 of the data block 408 "D0D1D2D3D4D5D6D7" can be formed in eight bytes of "D0", "D1", "D2", "D3", "D4", "D5", "D6", and "D7".

The block payload 406 of the control block 410 can be formed in any number of bits or bytes. The block payload 406 of the control block 410 can include the block type field 412 and the control block payload 414.

For example, the block payload 406 of the control block 410 can be formed in eight bytes. The control block 410 of "C0C1C2C3/S4D5D6D7" includes the sync header 404 "10" and the block payload 406 including the block type field 412 "0x33" and the control block payload 414 "C0", "C1", "C2", "C3", four bits of "1" (i.e. for implying the start of a data sequence), "D5", "D6", and "D7".

For example, the block type field 412 can be encoded in eight bits for representing a number of predefined types of the control block 410. The example depicts fifteen of the predefined types.

Each of the predefined types can indicate the format of the remaining sixty-four bits in the block payload 406. The control block payload 414 can include control characters (C), data characters (D), ordered-set characters (O), and a variable-length string of binary bit '1' based on the format (i.e. numbers and bit positions thereof) indicated by the block type field 412. While not included in the block payload 406 but implied by the block type field 412, a start character (S) and a terminate character (T) can indicate the beginning and ending of the data sequence, respectively.

For example, eight of the 64b/66b blocks (i.e. the input block 402) can be transcoded to a 512b/513b block (i.e. the encoded block 416 of FIG. 4). Transcoding eight of the 64b/66b blocks to the 512b/513b block can include encoding two bits of the sync header 404 and eight bits of the block type field 412 to eight bits of the control field 420 of FIG. 4 and one bit of the flag bit 430 of FIG. 4. Such transcoding can reduce the amount of payload to be transmitted by approximately 3% mostly by eliminating two bits of the sync header 404 of the 64b/66b block.

Figure 6:
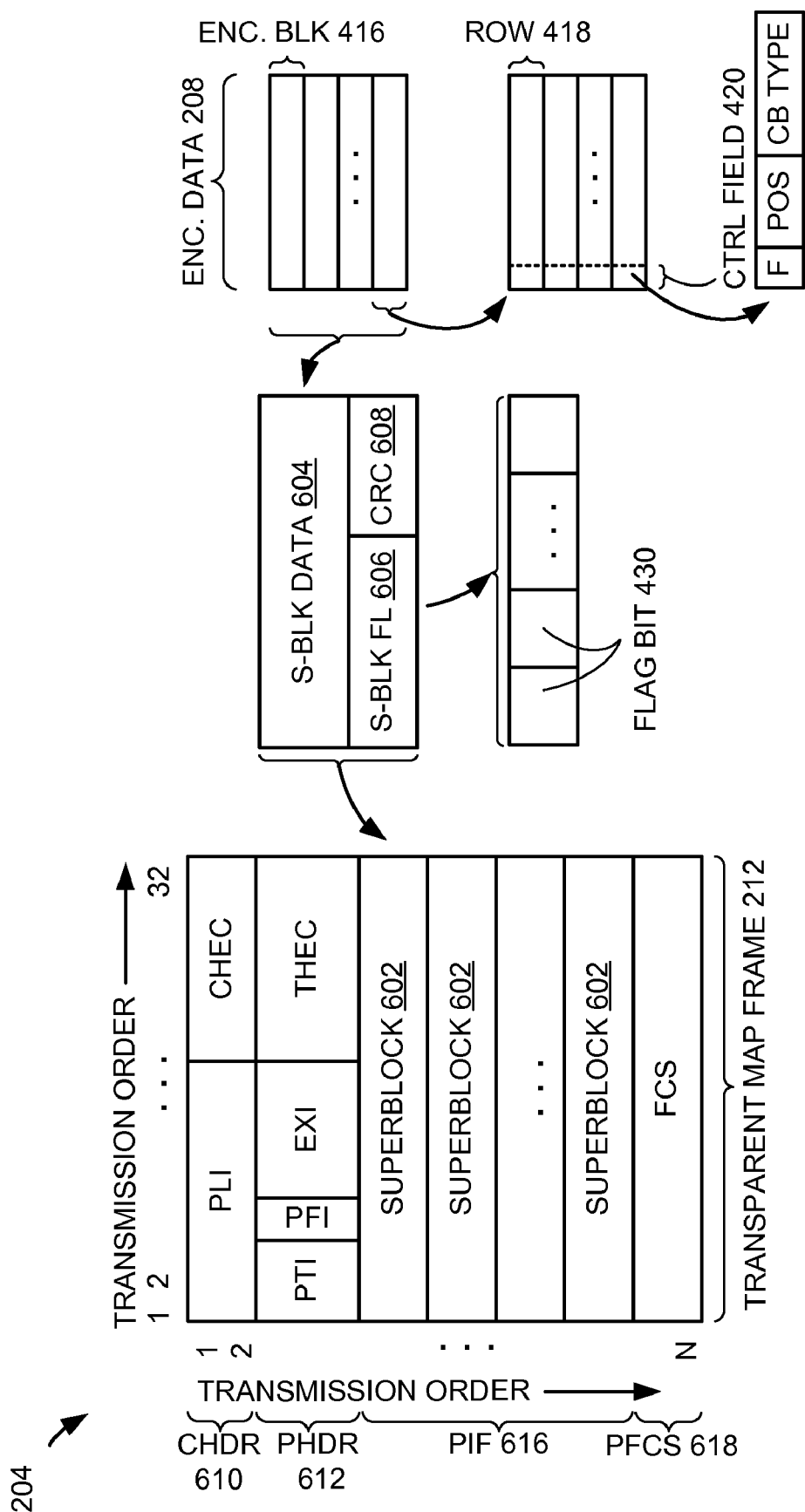
FIG. 6 is a transparent mapping function of the transparent mapping unit of FIG. 2.

Referring now to FIG. 6, therein is shown a transparent mapping function of the transparent mapping unit 204 of FIG. 2. The transparent mapping function can include combining a number of the encoded block 416 into a superblock 602 and mapping a number of the superblock 602 into the transparent mapped frame 212.

The encoded block 416 of the encoded data 208 can include a number of the row 418 including information of the data block 408 of FIG. 4 or the control block 410 of FIG. 4. The row 418 that includes information of the control block 410 of FIG. 4 can include the control field 420 which can include the flag continuation field 424 of FIG. 4, the position field 426 of FIG. 4, and the control block type 428 of FIG. 4.

The superblock 602 can be generated by combining a number of the encoded block 416. The superblock 602 can include superblock data 604, superblock flags 606, a cyclic redundancy check 608 (CRC), or any combination thereof. Except for the flag bit 430 of the encoded block 416, the content of the encoded block 416 can be combined to generate the superblock data 604. The flag bit 430 can be combined to generate the superblock flags 606.

The cyclic redundancy check 608 can be optionally generated. The cyclic redundancy check 608 can be used by a receiver of the cyclic redundancy check 608 to check the integrity of the control field 420 of the encoded block 416 in the superblock data 604.

A number of the superblock 602 can be combined and mapped into the transparent mapped frame 212, which can include a transparent generic framing procedure (GFP-T) frame as an example. The transparent mapped frame 212 can include a core header 610, a payload header 612, a payload information field 614, and a payload frame check sequence 616 (FCS).

The core header 610 can include information about the transparent mapped frame 212 including a payload length indicator (PLI) and a core header error check (cHEC) for error detection and correction of the core header 610. The payload header 612 can include information about the payload of the transparent mapped frame 212 including a payload type identifier (PTI), a payload FCS identifier (PFI), an extension header identifier (EXI), and a type header error check (tHEC) for error detection and correction of the payload header 612.

The payload information field 614 can include a number of the superblock 602 combined as the payload of the transparent mapped frame 212. The payload frame check sequence 616 can be optionally generated to include redundancy for error detection for the payload information field 614. The transmission order of the information of the transparent mapped frame 212 can include sending in an order of the PLI, the cHEC, the PTI, the PFI, the EXI, the tHEC, the superblock 602, and the FCS.

The transmission rate of the transparent mapped frame 212 can depend on number of the encoded block 416 per the superblock 602, number of the superblock 602 per the transparent mapped frame 212 and number of bits of the cyclic redundancy check 608 per the superblock 602.

Figure 7:
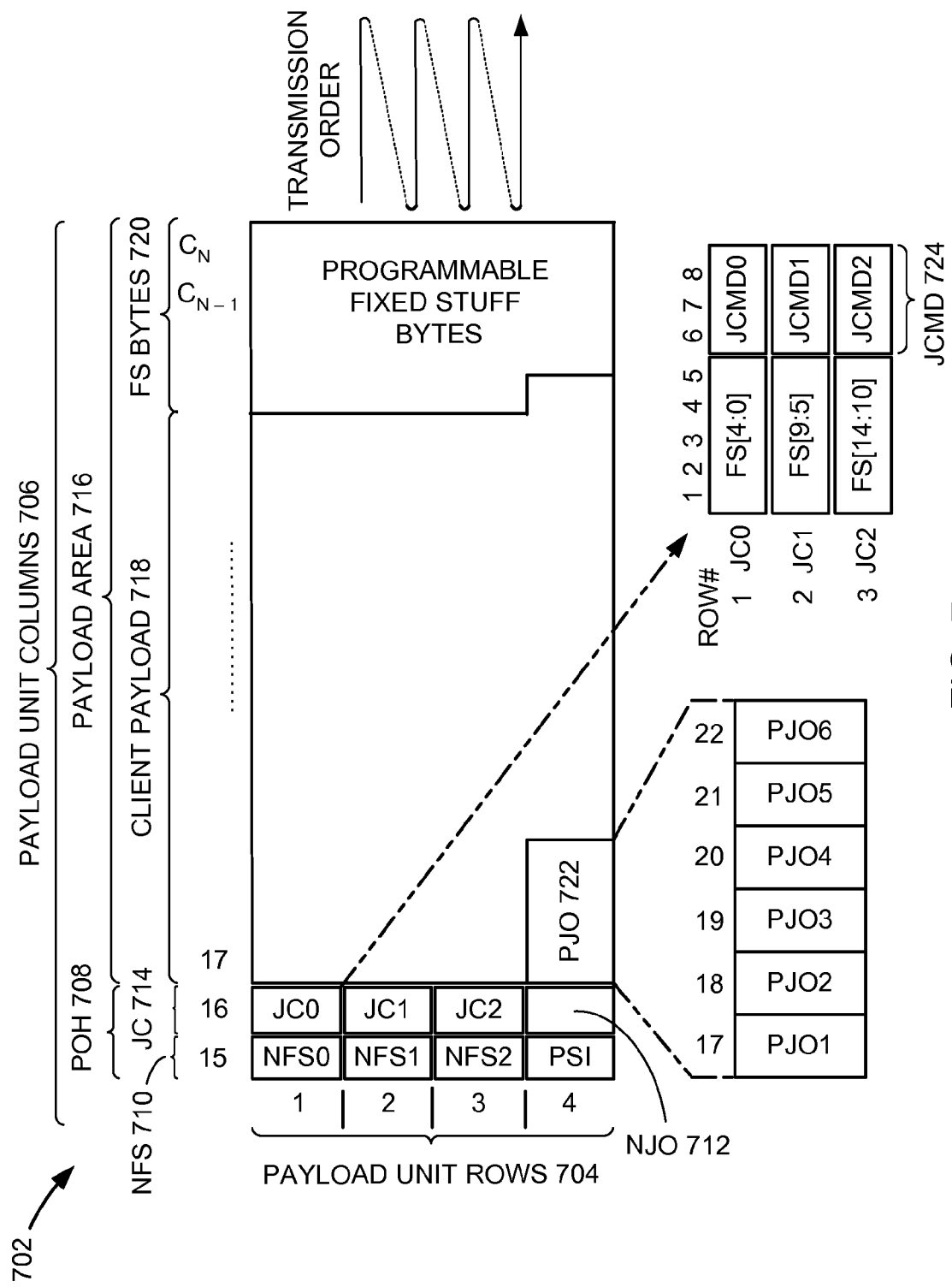
FIG. 7 is a constant bit rate mapping function of the asynchronous mapping unit of FIG. 2.

Referring now to FIG. 7, therein is shown a constant bit rate mapping function of the asynchronous mapping unit 218 of FIG. 2. The constant bit rate (CBR) mapping function can include mapping the transparent mapped frame 212 of FIGS. 2 and 3 into a payload unit 702. For example, the payload unit 702 can include an optical channel payload unit (OPU), an optical channel data tributary unit (ODTU), or any payload unit with a different structure format.

The payload unit 702 can include a number of payload unit rows 704 and payload unit columns 706. The number of the payload unit rows 704 and the payload unit columns 706 can be determined by the payload capacity of the payload unit 702. For example, the number of the payload unit rows 704 and the payload unit columns 706 can be 4 and 3824 for an OPU2, respectively.

The first fourteen (not shown) of the payload unit columns 706 can include additional information such as frame alignment, transport unit overhead, and data unit overhead. For example, information related to the frame alignment can include frame alignment signal (FAS) and multiframe alignment signal (MFAS). Also for example, information related to the transport unit overhead can include section monitoring (SM) and general communication channel (GCC0). Further for example, information related to the data unit overhead can include tandem connection monitoring (TCM), path monitoring (PM), general communication channel (GCC1 and GCC2), automatic protection switching coordination channel (APS), protection communication control channel (PCC), and fault type & fault location reporting channel (FTFL).

The payload unit 702 can include a payload overhead 708 (POH). The payload overhead 708 can include a payload structure identifier (PSI), negative fixed stuff bytes 710 (NFS), a negative justification opportunity byte 712 (NJO), and justification control bytes 714 (JC).

The payload unit 702 can include a payload area 716 including a client payload 718 and fixed stuff bytes 720. The fixed stuff bytes 720 can represent bits in a frame or a container that do not represent any client data or real information. The fixed stuff bytes 720 are used only to populate a portion of a frame or a container when the nominal client data rate is less than the nominal rate of transmitting the frame or the container.

The payload area 716 can include positive justification opportunity bytes 722 (PJO). The client payload 718 can include the transparent mapped frame 212 of FIG. 6.

The positive justification opportunity bytes 722 can include up to six bytes in columns 17 to 22 of the payload unit columns 706 and row 4 of the payload unit rows 704. The fixed stuff bytes 720 can be included in the end of the payload unit 702 or anywhere in the payload area 716. The justification control bytes 714 can be included in the payload unit columns 706 of 16 and the payload unit rows 704 of 1 to 3.

For illustrative purposes, the payload unit 702 is shown with the payload overhead 708 in the payload unit columns 706 of 15 and 16, the positive justification opportunity bytes 722 in the payload unit columns 706 from 17 to 22 and the payload unit rows 704 of 4, and the fixed stuff bytes 720 in the end of the payload unit 702, although it is understood that the payload unit 702 can include a different structure format. For example, the fixed stuff bytes 720 can be included in the middle of the payload area 716.

The CBR mapping can include any asynchronous or synchronous wrapping of a client signal of any rate into the payload unit 702, which can include the fixed stuff bytes 720, the negative justification opportunity byte 712, and the positive justification opportunity bytes 722. The number of the fixed stuff bytes 720 can be configured from 0 to the number of bytes that can be included in the payload area 716.

The fixed stuff bytes 720 can be added for allowing multiplexing or aggregating multiple data units. For example, the fixed stuff bytes 720 can be added for multiplexing four optical data unit type 2 (ODU2s) into an optical data unit type 3 (ODU3). The number of the fixed stuff bytes 720 can be encoded in the upper bits of the justification control bytes 714 JC0, JC1, and JC2.

The number of the negative justification opportunity byte 712 and the positive justification opportunity bytes 722 can depend on the rate and frequency tolerance of the client signal and the rate and frequency tolerance of the payload unit 702. For example, the number can be configured so that the minimum rate of the payload unit 702 to be transmitted is greater than the maximum rate of the client signal that has been received.

For illustrative purposes, the number of the negative justification opportunity byte 712 and the positive justification opportunity bytes 722 are shown as 1 and up to 6, respectively, although there can be any number of the negative justification opportunity byte 712 and the positive justification opportunity bytes 722. The number of the negative justification opportunity byte 712 and the positive justification opportunity bytes 722 used in the payload unit 702 can be encoded into a justification command 724 (JCMD) for indicating how many justification bytes are included in the negative justification opportunity byte 712 and the positive justification opportunity bytes 722. The justification command 724 can be encoded in the lower bits of the justification control bytes 714.

The number of justification bytes can indicate how much justification is necessary for matching the rate of the payload unit 702 to the rate of the client signal. There can be up to eight justification levels with 3 bits of the justification command 724.

For illustrative purposes, the justification command 724 is shown with 3 bits, although the justification command 724 can be generated with any number of bits. For example, the justification command 724 can be generated with 4 bits for indicating up to 16 justification levels.

The justification byte can include eight bits of "0". The justification bytes can be used as stuffing bytes for adapting the rate of the payload unit 702 to the rate of the client signal.

For example, the justification command 724 of "000" can be defined as a null justification level, which can indicate that the rate of the payload unit 702 matches the rate of the client signal, and no justification is required. The null justification level can indicate that the negative justification opportunity byte 712 includes a justification byte and the positive justification opportunity bytes 722 include data bytes.

Also for example, the justification command 724 of "001" can indicate that the rate of the payload unit 702 is lesser than the rate of the client signal, and a negative justification level is required. The negative justification level can indicate that the negative justification opportunity byte 712 and the positive justification opportunity bytes 722 include data bytes.

Further for example, the justification command 724 of "011" can indicate that the rate of the payload unit 702 is greater than the rate of the client signal, and a positive justification level of +1 is required. The positive justification level of +1 can indicate that the negative justification opportunity byte 712 includes a justification byte, the positive justification opportunity bytes 722 PJO1 includes a justification byte, and the positive justification opportunity bytes 722 PJO2 to PJO6 include data bytes.

For applications that require a slightly extended payload area, the negative fixed stuff bytes 710 can include data bytes. Such applications can include those that require a slightly higher rate of the client signal compared to the rate of the payload unit 702. In this case, the negative fixed stuff bytes 710 can be considered as part of the payload area 716 for carrying data bytes of the client signal.

Asynchronous mapping can be performed with a local clock and can include functions for translating the rate differences between the rate of the client signal and the rate of the payload unit 702 into the justification command 724. Synchronous mapping can be performed with a clock derived from the rate of the client signal based on a predetermined clock ratio and may not need the justification command 724.

Figure 8:
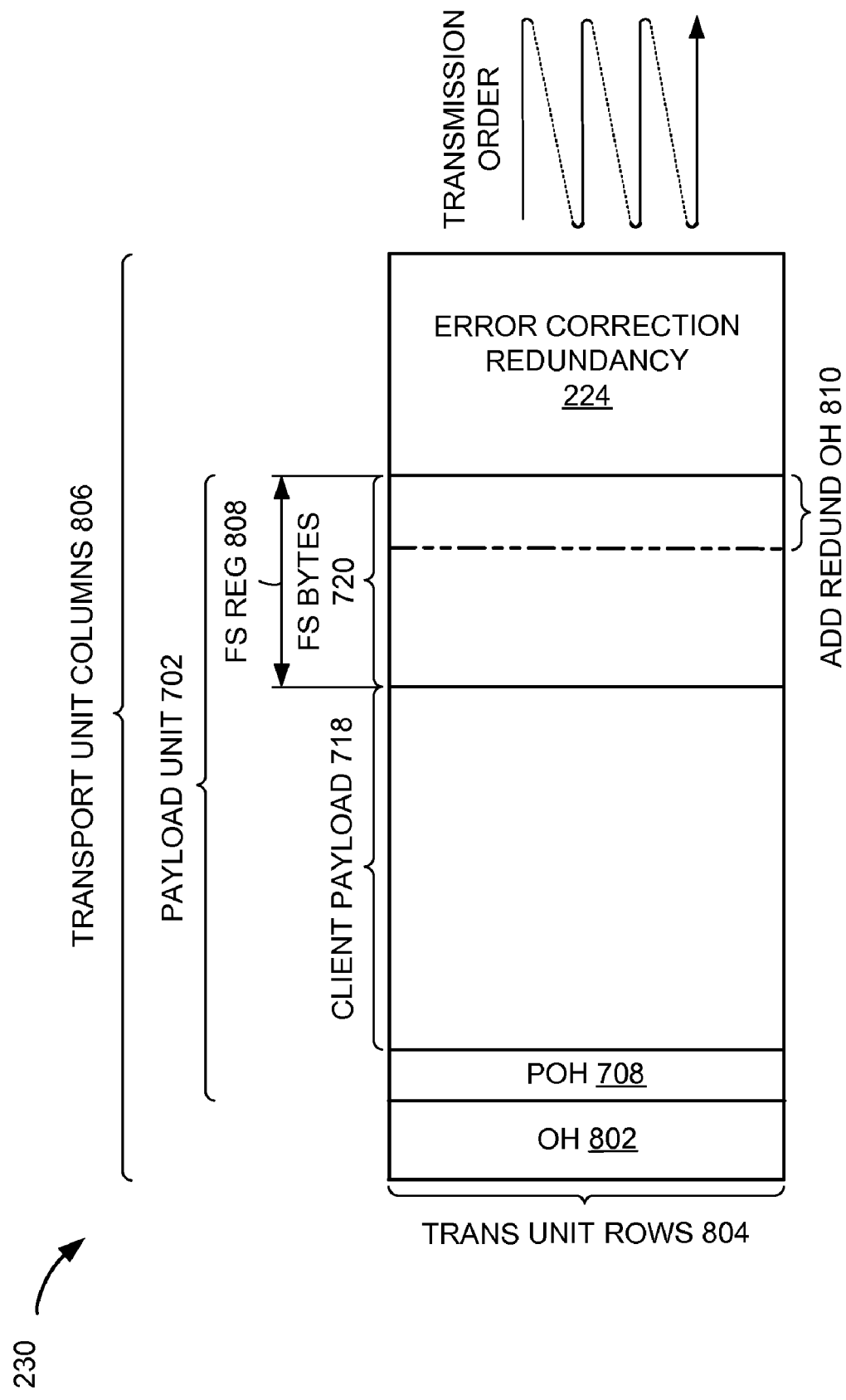
FIG. 8 is a structure of the output frame of FIG. 2.

Referring now to FIG. 8, therein is shown a structure of the output frame 230 of FIG. 2. The output frame 230 can include an overhead 802, which an include information such as frame alignment, transport unit overhead, and data unit overhead. For example, the output frame 230 can represent an optical channel transport unit-k (OTUk), where k can be any value such as 2, 3, and 4 for transmission of 10G, 40G, and 100G client signals.

The structure can include any number of transport unit rows 804 and transport unit columns 806. For example, the number of the transport unit rows 804 and the transport unit columns 806 can be 4 and 4080, respectively, in an OTU2(e/eV) frame.

For example, information related to the frame alignment can include frame alignment signal (FAS) and multiframe alignment signal (MFAS). Also for example, information related to the transport unit overhead can include section monitoring (SM) and general communication channel (GCC0). Further for example, information related to the data unit overhead can include tandem connection monitoring (TCM), path monitoring (PM), general communication channel (GCC1 and GCC2), automatic protection switching coordination channel (APS), protection communication control channel (PCC), and fault type & fault location reporting channel (FTFL).

The output frame 230 can include the payload unit 702, which can include the payload overhead 708, the client payload 718, and the fixed stuff bytes 720. The output frame 230 can include the error correction redundancy 224.

The client payload 718 can include the transparent mapped frame 212 of FIG. 6. The transparent mapped frame 212 of FIG. 6 can be mapped with multiple blocks of the encoded data 208 of FIG. 6.

The output frame 230 can be generated with the encoded data 208 and the error correction redundancy 224. The error correction redundancy 224 can be inserted at a variable position in the output frame 230.

For example, the error correction redundancy 224 can be inserted anywhere in the payload unit 702. Also for example, the error correction redundancy 224 can be inserted in or adjacent to a fixed stuff region 808 of the fixed stuff bytes 720 in the output frame 230. The fixed stuff region 808 can include a region in the output frame 230 that can be used to insert the fixed stuff bytes 720.

In applications that require an additional redundancy overhead 810 for the error correction redundancy 224 for increasing the net coding gain 202 of FIGS. 2 and 3, the additional redundancy overhead 810 can be included in the fixed stuff region 808, thereby reducing the number of the fixed stuff bytes 720. As an example, the error correction redundancy 224 can be included in 23×16 columns in the output frame 230.

Figure 9:
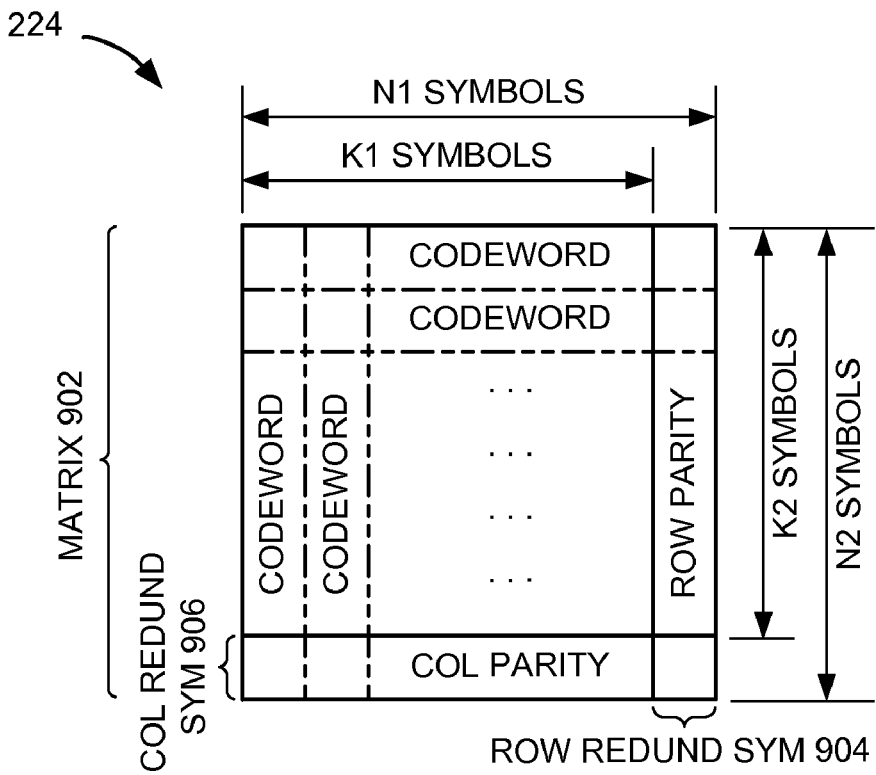
FIG. 9 is a structure of the error correction redundancy of FIG. 2.

Referring now to FIG. 9, therein is shown a structure of the error correction redundancy 224 of FIG. 2. The structure can represent a structure of a code which can include two orthogonally concatenated code classes, although any number of concatenated code classes can be included. For example, the structure can include two orthogonally concatenated Bose-Chaudhuri-Hocquenghem (BCH) code classes called row encoding and column encoding.

The structure of the error correction redundancy 224 can be represented in a matrix 902. The matrix 902 can include any number of rows and columns of codewords with N1 and N2 symbols of which K1 and K2 symbols are information symbols, respectively, representing the client payload 718 of FIG. 7 and the fixed stuff bytes 720 of FIG. 7. Row redundancy symbols 904 and column redundancy symbols 906 can include "N1-K1" symbols and "N2-K2" symbols, respectively.

The row encoding and column encoding of the codewords can be performed with any generator polynomials for generating the row redundancy symbols 904 and the column redundancy symbols 906, respectively. The row redundancy symbols 904 and the column redundancy symbols 906 can be generated based on any error correction codes including forward error correction (FEC) codes, BCH codes, Reed-Solomon (R-S) codes, turbo product codes, turbo codes, Viterbi FEC codes, Golay codes as examples. An encoding scheme for generating the row redundancy symbols 904 and the column redundancy symbols 906 can include any communication coding including channel coding, algebraic coding, convolutional coding, or a combination thereof.

The encoding scheme can include a concatenated coding which can include an algebraic code followed by a convolutional code. A concatenated decoding can be a mirror image of the concatenated coding. The concatenated decoding can enable any bursty errors uncorrected by a convolutional decoder corrected by an algebraic decoder since algebraic decoding can be most effective in correcting bursty errors. Performance can be further enhanced by interleaving code classes between coding stages to mitigate any bursts of errors that may be too long for the algebraic decoder to process.

Figure 10:
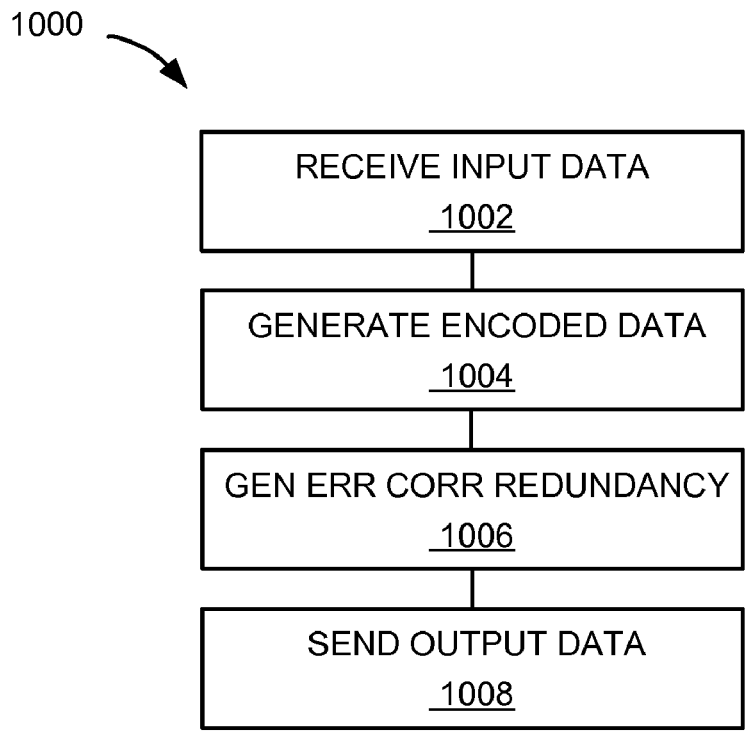
FIG. 10 is a flow chart of a method of operation of a transport network system in a further embodiment of the present invention.

Referring now to FIG. 10, therein is shown a flow chart of a method 1000 of operation of a transport network system in a further embodiment of the present invention. The method 1000 includes: receiving input data having an input encoding in a block 1002; generating encoded data, having a transcode encoding, from the input data in a block 1004; generating an error correction redundancy for the encoded data in a block 1006; and sending an output frame, having the encoded data and the error correction redundancy, for increasing a net coding gain of the output frame based on the transcode encoding and the error correction redundancy in a block 1008.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a transport network system comprising:
   receiving input data having an input encoding;
   generating encoded data, having a transcode encoding, from the input data;
   generating an error correction redundancy for the encoded data includes selecting a redundancy coding ratio in an approximate range of 7% to 16.7% of an output frame for the error correction redundancy; and
   sending the output frame, having the encoded data and the error correction redundancy, for increasing a net coding gain of the output frame, the net coding gain in an approximate range of 6.2 dB to 11.3 dB based on the transcode encoding and the redundancy coding ratio.

2. The method as claimed in claim 1 wherein generating the encoded data, having the transcode encoding, includes reducing a payload capacity rate of the encoded data based on the transcode encoding.

3. The method as claimed in claim 1 wherein generating the encoded data, having the transcode encoding, from the input data includes converting the input data to the encoded data with less number of bits.

4. The method as claimed in claim 1 further comprising generating the output frame with the encoded data and the error correction redundancy with the error correction redundancy at a variable position in the output frame.

5. The method as claimed in claim 1 wherein generating the encoded data, having the transcode encoding, from the input data includes generating the encoded data with the transcode encoding different than the input encoding.

6. A method of operation of a transport network system comprising:
   receiving input data having an input encoding;
   generating encoded data, having a transcode encoding, from the input data;
   generating a transparent mapped frame with the encoded data;
   generating an asynchronous mapped frame with the transparent mapped frame;
   generating an error correction redundancy for the encoded data includes selecting a redundancy coding ratio in an approximate range of 7% to 16.7% of an output frame for the error correction redundancy; and
   sending the output frame, having the encoded data and the error correction redundancy, for increasing a net coding gain of the output frame, the net coding gain in an approximate range of 6.2 dB to 11.3 dB based on the transcode encoding and the redundancy coding ratio.

7. The method as claimed in claim 6 wherein:
   generating the encoded data includes reducing a payload capacity rate of the encoded data based on the transcode encoding; and
   further comprising:
   selecting a redundancy coding ratio for the error correction redundancy.

8. The method as claimed in claim 6 wherein generating the encoded data, having the transcode encoding, from the input data includes encoding a block type field of the input data for generating a control block type of the encoded data, the control block type encoded with less number of bits compared to the block type field.

9. The method as claimed in claim 6 further comprising generating the output frame with the encoded data and the error correction redundancy with the error correction redundancy in or adjacent to a fixed stuff region in the output frame.

10. A transport network system comprising:
    a transparent mapping unit for receiving input data having an input encoding and generating a transparent mapped frame with encoded data, having a transcode encoding, from the input data;
    an asynchronous mapping unit, coupled to the transparent mapping unit, for generating an asynchronous mapped frame with the transparent mapped frame;
    a redundancy generation unit, coupled to the transparent mapping unit, for selecting a redundancy coding ratio in an approximate range of 7% to 16.7% of the output frame for generating an error correction redundancy for the encoded data; and
    a transmit line interface unit, coupled to the redundancy generation unit, for sending an output frame, having the encoded data and the error correction redundancy, for increasing a net coding gain of the output frame, the net coding gain in an approximate range of 6.2 dB to 11.3 dB based on the transcode encoding and the redundancy coding ratio.

11. The system as claimed in claim 10 wherein the transparent mapping unit is for reducing a payload capacity rate of the encoded data based on the transcode encoding.

12. The system as claimed in claim 10 wherein the transparent mapping unit is for converting the input data to the encoded data with less number of bits.

13. The system as claimed in claim 10 wherein the transmit line interface unit is for generating the output frame with the encoded data and the error correction redundancy with the error correction redundancy at a variable position in the output frame.

14. The system as claimed in claim 10 wherein the transparent mapping unit is for generating the encoded data with the transcode encoding different than the input encoding.

15. The system as claimed in claim 10 wherein:
the transparent mapping unit is for reducing a payload capacity rate of the encoded data based on the transcode encoding; and
the redundancy generation unit is for selecting a redundancy coding ratio for the error correction redundancy.

16. The system as claimed in claim 10 wherein the transparent mapping unit is for encoding a block type field of the input data for generating a control block type of the encoded data, the control block type encoded with less number of bits compared to the block type field.

17. The system as claimed in claim 10 wherein the transmit line interface unit is for generating the output frame with the encoded data and the error correction redundancy with the error correction redundancy in or adjacent to a fixed stuff region in the output frame.

* * * * *